United States Patent [19]
Hatano et al.

[11] Patent Number: 5,830,778
[45] Date of Patent: Nov. 3, 1998

[54] METHOD OF MANUFACTURING A CHARGE TRANSFER DEVICE

[75] Inventors: Keisuke Hatano; Yuji Surisawa; Yasutaka Nakashiba, all of Tokyo, Japan

[73] Assignee: NEC Corporation, Tokyo, Japan

[21] Appl. No.: 828,337

[22] Filed: Mar. 28, 1997

[30] Foreign Application Priority Data

Mar. 29, 1996 [JP] Japan .................................... 8-075054

[51] Int. Cl.$^6$ .......................... H01L 21/00; H01L 21/339
[52] U.S. Cl. .............................................. 438/60; 438/144
[58] Field of Search .................................. 438/60, 75, 76, 438/77, 78, 79, 144, 145, 146, 147, 148, 587

[56] References Cited

U.S. PATENT DOCUMENTS

| | | | |
|---|---|---|---|
| 5,442,207 | 8/1995 | Jeong | 257/221 |
| 5,646,427 | 7/1997 | Smith et al. | 257/232 |

FOREIGN PATENT DOCUMENTS 63-9152  1/1988  Japan .

OTHER PUBLICATIONS

Homma et al., "Fully Planarized Multilevel Interconnection using Selective SiO$^2$ Deposition", NEC Research & Develop., vol. 32, No. 3, pp. 315–321, Jul. 1991.

*Primary Examiner*—Brian Dutton
*Attorney, Agent, or Firm*—Foley & Lardner

[57] ABSTRACT

In a charge transfer device including single-layer charge transfer electrodes including a p-type polycrystalline silicon layer and an n-type polycrystalline silicon layer, the sizes of the charge accumulation and potential barrier regions can be set to desired values and the height of potential barrier is produced with a desired reproducibility.

A polycrystalline silicon layer is fabricated on a surface of a semiconductor substrate. With a photoresist layer 106 as a mask, ions of phosphorus are implanted thereinto so as to form a silicon oxide layer by liquid phase growth. Boron ions are then injected thereinto. The junction region between the n-type and p-type polycrystalline silicon layers is etched for the separation of the charge transfer electrodes.

8 Claims, 8 Drawing Sheets

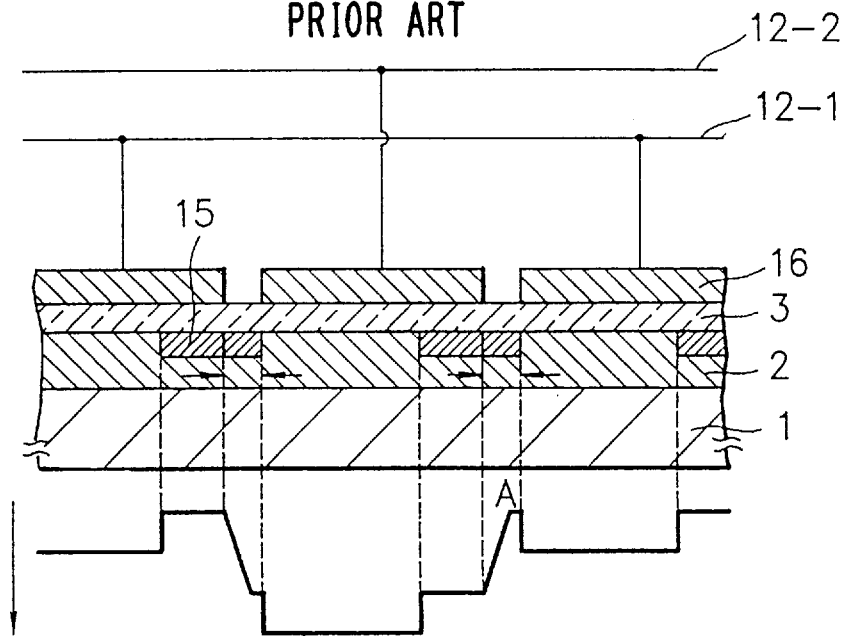
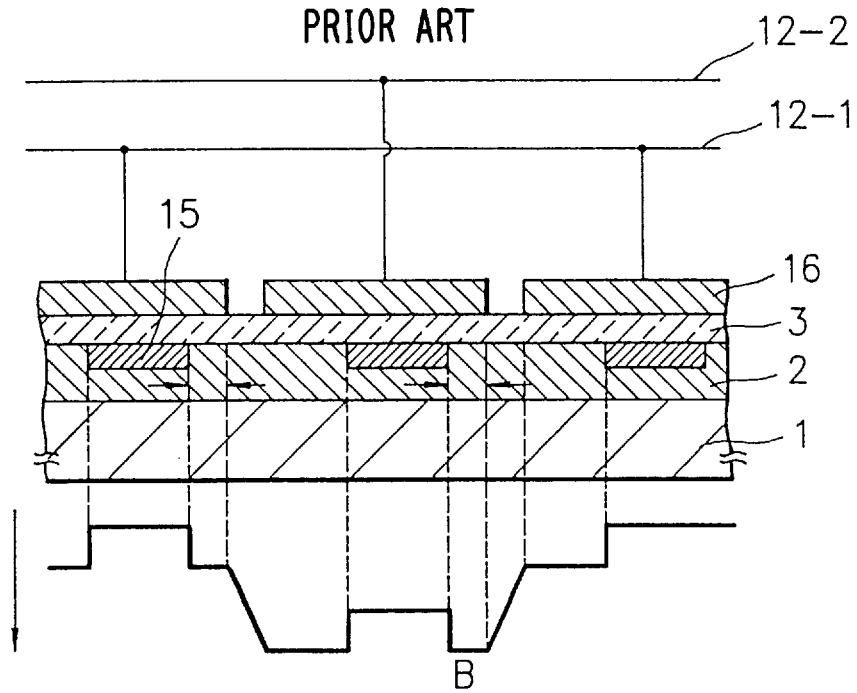

5,830,778

METHOD OF MANUFACTURING A CHARGE TRANSFER DEVICE

BACKGROUND OF THE INVENTION

The present invention relates to a method of manufacturing a charge transfer device including a charge accumulation region and a potential barrier region, and in particular, to a method of manufacturing a charge transfer device in which a charge transfer electrode includes polycrystalline silicon layers of two mutually different conduction types.

DESCRIPTION OF THE RELATED ART

In association with the recent development of fine machining technologies, it is possible to fabricate a charge transfer device having a single-layer electrode structure in which electrodes are manufactured at an interval of about 0.2 micrometer to about 0.3 micrometer by etching a single-layer conductive material thereof. The electrodes are not overlapped with each other in the charge transfer device of the single-layer electrode configuration, which consequently leads to the advantageous feature that the interlayer capacitance between the related layers is reduced. Moreover, insulation failures between electrodes are possibly removed. In addition, according to the structure above, oxidation of electrodes for the production of interlayer insulation films becomes unnecessary. This results in advantages that the electrodes may be fabricated with, in addition to a layer of polycrystalline silicon, a layer of a metal and/or an oxide thereof, leading to the reduction in resistance of the electrodes.

FIGS. 1A to 1D are cross-sectional views for explaining a first conventional example of a two-phase drive charge transfer device in relation to a manufacturing process thereof, where the device includes buried-channel single-layer electrodes.

First, as can be seen from FIG. 1A, on a surface area of a p-type semiconductor substrate 1 (or a p-type well in a surface area of an n-type semiconductor substrate) made of silicon, there is selectively formed an n-type semiconductor layer 2 (embedded channel). Fabricated thereon is a gate insulation layer 3 by thermal oxidation.

Subsequently, as shown in FIG. 1B, using as a mask a photoresist film 14 manufactured through a photolithographic process, an impurity substance, e.g., boron having a conductance type opposite to that of the n-type semiconductor region 2 is introduced thereinto by ion injection. This forms a potential barrier region 15 of an n$^-$-type semiconductor region.

Thereafter, on an interlayer insulation layer (not shown) there is provided a layer 16 onto which metallic wirings 12-1 and 12-2 are provided to establish connections respectively for every second conductive electrodes (charge transfer electrodes 16) as shown in FIG. 1D. This manufactures a charge transfer device of a single-layer electrode and a two-phase drive type.

However, in the charge device of the prior art described above, the conductive electrode and potential barrier regions are not formed in a self-aligning manner. Therefore, as can be seen from FIGS. 2 and 3, due to a positional shift or discrepancy between the conductive electrode 16 and the potential barrier region 15, an area appears that has a high electric potential (A in FIG. 2) and an area that has a low potential (B in FIG. 3) respectively at end positions of conductive electrodes 16. This leads to a drawback of the prior art because this hinders the smooth transfer of charge.

Incidentally, FIGS. 2 and 3 are diagrams showing changes in potential levels at the time when the electric charge, that is just below the charge transfer electrode 16 coupled with the wiring 12-1 to which transfer pulse $\phi1$ is applied, is moved to a place below the charge transfer electrode 16 linked with wiring 12-2 to which transfer pulse $\phi2$ is applied. One example of this is when the pulses are respectively at levels of 0 V and 10 V.

In the two-phase drive charge transfer device of the single-layer electrode structure above, the conductive electrode and potential barrier regions are not formed in a self-aligning manner. This leads to the problem wherein the smooth transfer of charge is prevented.

To remove the problem, a technology has been described (second conventional example) in the Japanese Patent Laid-Open Ser. No. 63-9152 in which the impurity concentration is locally varied in a polycrystalline silicon layer serving as charge transfer electrodes such that the depth of potential wells formed below the electrodes are altered according to the built-in potential thereof. In other words, as can be seen from FIG. 4A, a gate insulation layer 3 is manufactured on a surface of a p-type semiconductor substrate 1 made of silicon to fabricate an n$^-$-type semiconductor region 2 thereon. Formed on the layer 3 is a p-type polycrystalline silicon layer 17 on which a layer metal 19 is provided using, for example, molybdenum for the patterning in band-shaped regions. Using the metallic layer 19 as a mask, an ion injection is then conducted with ions of, for example, arsenic to fabricate ion injection regions 18, the ion injection being achieved with an inclined angle onto the pertinent surface. Subsequently, as can be seen from FIG. 4B, an SiO$_2$ layer 20 is formed by chemical vapor deposition and then spacer regions 20$a$ are manufactured by reactive etching as shown in FIG. 4C. Subsequently, using the metallic layer 19 and spacer regions 20$a$ as a mask, an etching process is carried out to form separation or isolation grooves 21 as shown in FIG. 4D.

However, in accordance with the manufacturing process above, the ion injection is carried out with an inclined angle using as the mask the metallic layer manufactured on the polycrystalline silicon electrodes to thereby form regions different from each other in impurity concentration. Consequently, the dimensional ratio between the charge accumulation region and the charge barrier region cannot be easily set to an arbitrary value. This results in a problem of restriction with respect to the setting of the charge transfer efficiency and the maximum transfer charge. Additionally, to form regions having different values of impurity concentration, the counter-doping process is achieved on a polycrystalline silicon layer previously beforehand doped with an impurity substance, which consequently leads to difficulty in the control of the impurity concentration as well as the height of the potential barrier. This results in the problem of fluctuation in the maximum amount of transfer charge.

SUMMARY OF THE INVENTION

It is therefore an object of the present invention to provide a method of a charge transfer device in a single-layer construction in which the dimensional ratio between the charge accumulation region and the charge barrier region can be arbitrarily set and the potential barrier region can be fabricated with satisfactory reproducibility.

To achieve the object above in accordance with the present invention, there is provided a method of manufacturing a charge transfer device including the step of fabricating a gate insulation layer and a polycrystalline silicon layer sequentially on a semiconductor region having a first conduction type in a surface of a semiconductor substrate, the layers covering a predetermined area of the surface of the semiconductor substrate. The method further includes the step of manufacturing a first mask layer extending through the predetermined area, e.g., at least a portion of the surface of the semiconductor substrate. The method further includes implantation of an impurity substance into the polycrystalline silicon layer below the first openings, thereby producing first regions of a first (or a second) conduction type, then fabricating a second mask layer in a self-aligning fashion with respect to the first openings, and removing the first mask layer and injecting an impurity substance of the second (or the first) conduction type into the polycrystalline silicon layer below the first mask layer. This forms a second region, separating the first and second regions into a plurality of charge transfer electrodes each including a pair of the first region and the second region adjacent thereto, and manufacturing first to N-th wirings for connecting every N−1 charge transfer electrodes to each other, where N is an integer greater than one.

In the method of manufacturing a charge transfer device, the predetermined area may include an embedded channel region of the second conduction type.

In accordance with the present invention, the method of manufacturing a charge transfer device includes the steps of fabricating a resist layer as the first mask layer and selectively accumulating a silicon oxide layer by liquid phase growth, thereby forming the second mask layer.

This method of manufacturing a charge transfer device includes the steps of fabricating the first mask layer with an acid resistant layer thereon and forming the second mask by selective oxidation using the acid resistant layer as a mask.

Moreover, this method of manufacturing a charge transfer device includes the steps of fabricating an interlayer insulation layer after the separation of charge transfer electrodes, forming a first connection hole and a second connection hole respectively reaching the first and second regions. Also, a conductive layer is accumulated filling the first and second connection holes with the conductive layer, and conducting a patterning operation thereon, thereby forming the first to N-th wirings.

Additionally, in accordance with the present invention, the method of manufacturing a charge transfer device includes the steps of fabricating an interlayer insulation layer after the separation of charge transfer electrodes, forming connection holes reaching the first (or the second) region, and accumulating a conductive layer, filling the connection holes with the conductive layer, and conducting a patterning operation thereon, thereby forming the first to N-th wirings.

The method of manufacturing a charge transfer device includes the step of removing a boundary between the first and second regions and a nearby region in the neighborhood thereof, e.g., in that at least a part of the nearby region is substantially adjacent to at least one of either the first or second regions. This step separates the charge transfer electrodes.

In designing the size of the first mask element and the second mask element as determined by the first opening it can be set to desired values in consideration of the charge transfer efficiency and maximum amount of transfer charge. It is possible to set the impurity concentration independently in the first and second regions.

BRIEF DESCRIPTION OF THE DRAWINGS

The objects and features of the present invention will become more apparent from the consideration of the following detailed description taken in conjunction with the accompanying drawings in which:

FIG. 2 is a potential diagram showing potential projection A due to the positional shift between the charge transfer electrode and potential barrier region in the conventional example of FIGS. 1A to 1D;

FIG. 3 is a potential diagram showing potential depression B caused by the positional shift between the charge transfer electrode and potential barrier region in the prior art of FIGS. 1A to 1D;

DESCRIPTION OF THE PREFERRED EMBODIMENTS

Description will now be given of a first embodiment of the method of manufacturing a charge transfer device in accordance with the present invention.

Figure 1A:
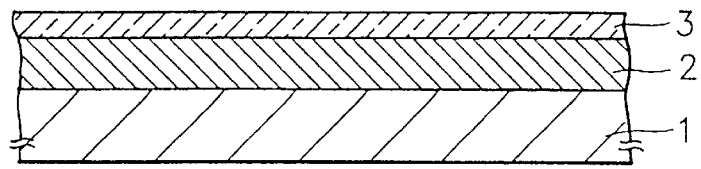
FIGS. 1A to 1D are cross-sectional diagrams for explaining a first conventional example.
Figure 1B:
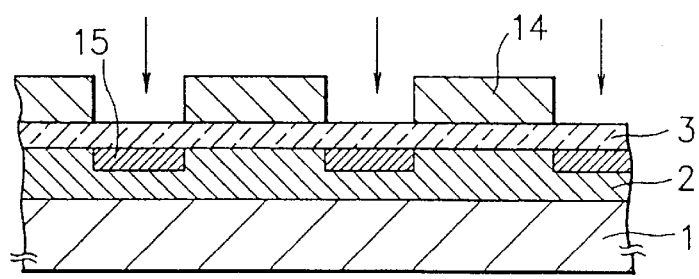
Figure 1C:
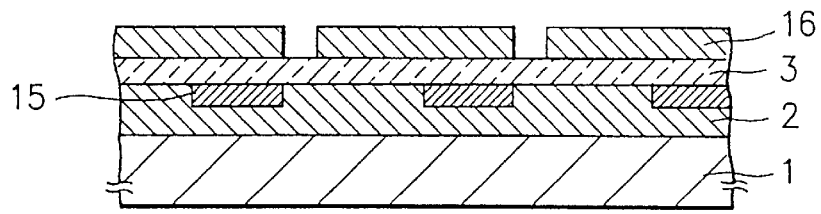
Figure 1D:
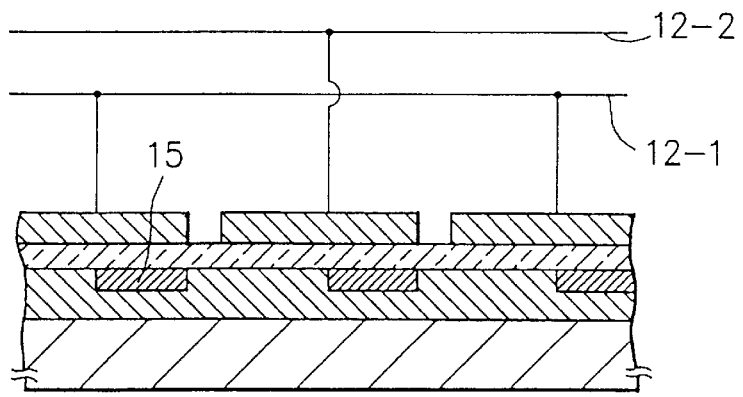
Figure 4A:
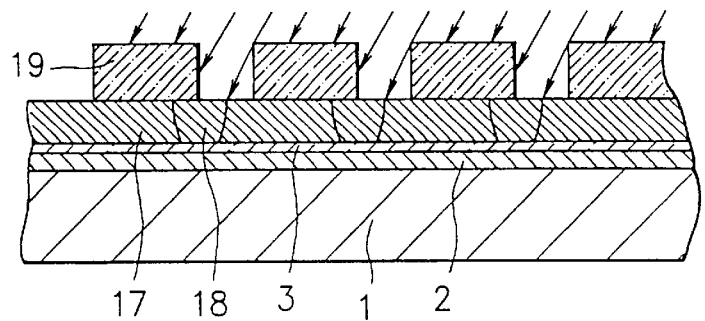
FIGS. 4A to 4D are cross-sectional diagrams for explaining a second conventional example.
Figure 4B:
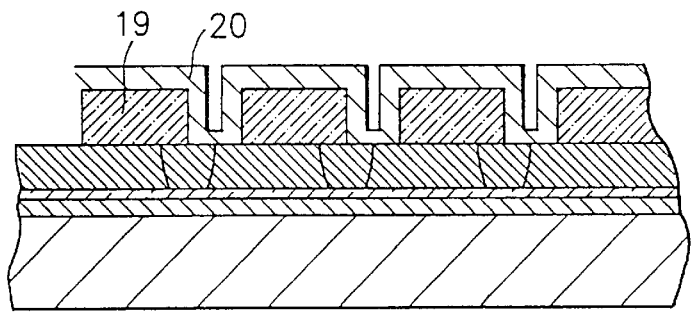
Figure 4C:
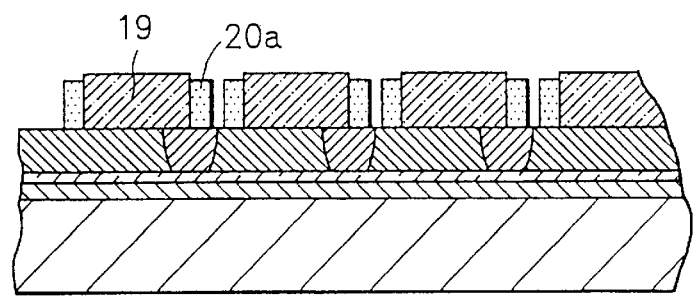
Figure 4D:
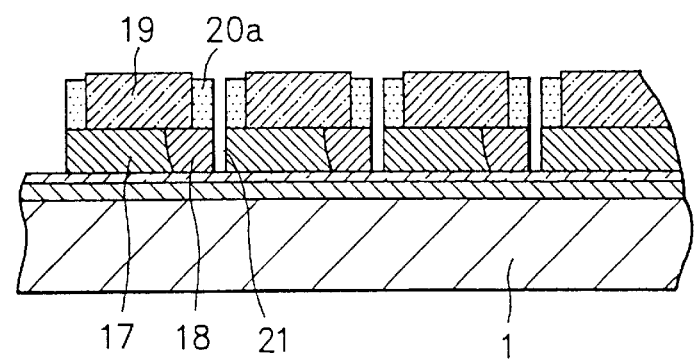
Figure 5A:
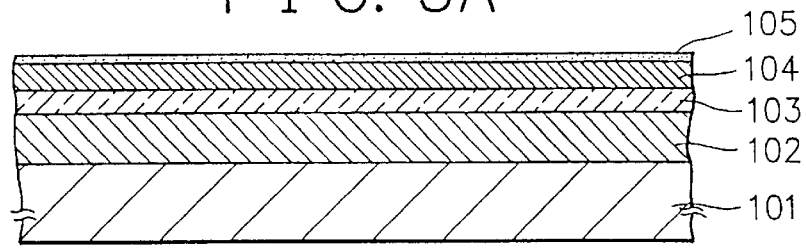
FIGS. 5A to 5D are cross-sectional views for explaining the configuration of a first embodiment of the method of manufacturing a charge transfer device in accordance with the present invention.
Figure 7A:
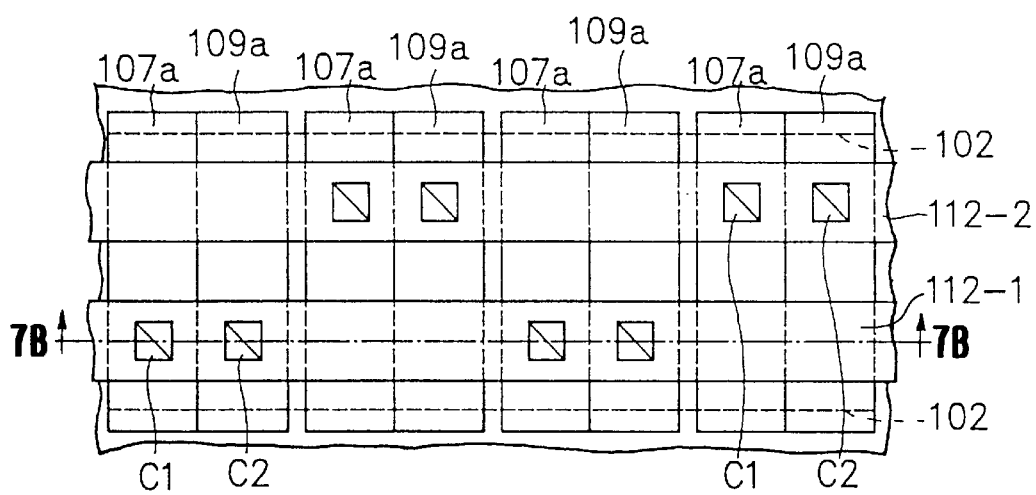
FIGS. 7A and 7B are a plan view and a cross-sectional view along line 7B—7B for explaining the first embodiment.
Figure 7B:
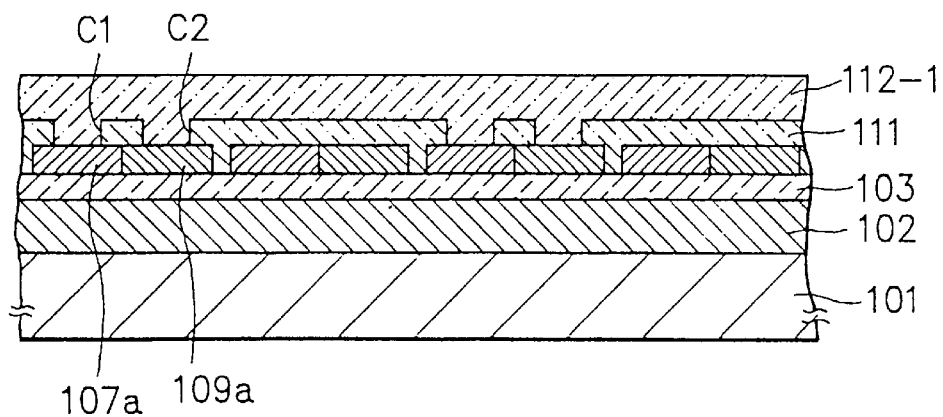

First, as can be seen from FIG. 5A, on a surface of a p-type semiconductor substrate 101 made of silicon having an impurity concentration of, for example, $1 \times 10^{15}$ cm$^{-3}$, there is formed a stripe-shaped n-type semiconductor layer 102 (n-type embedded channel region, where reference is to be made to FIGS. 7A and 7B) having an impurity concentration of $1 \times 10^{17}$ cm$^{-31}$ and a thickness or depth of about 0.5 micrometer relative to the surface of the substrate 101. A thermal oxidation process is conducted thereon to fabricate a gate insulation layer 103 on the surface of the n-type semiconductor layer 102 so as to for a non-doped polycrystalline silicon layer 104 as a conductive electrode substance having a thickness of about 0.2 micrometer. Manufactured on the layer 104, for example, by chemical vapor deposition, is a first silicon oxide layer 105 having a thickness of about 0.1 micrometer.

Figure 5B:
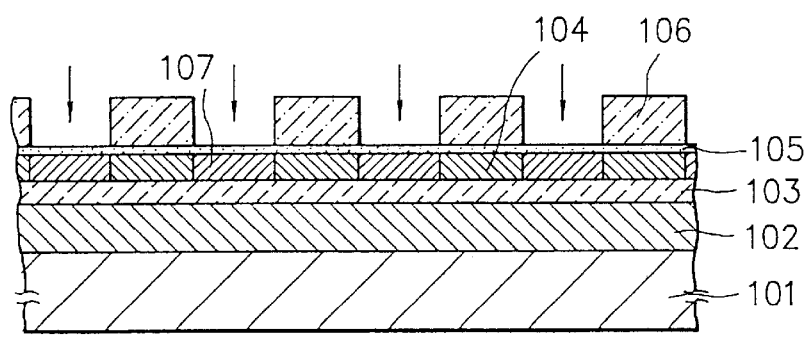

Subsequently, a photoresist layer 106 (first mask layer) including a first opening is fabricated through a photoetching process as shown in FIG. 5B. The layer 106 extends through the stripe-shaped n-type semiconductor layer 102 at a plurality of positions thereof with a fixed pitch. On the semiconductor layer 102, the photoresist layer region 106 and the first opening are designed to have the same dimension. Next, using the photoresist layer 106 as a mask, n-type impurity ions of phosphorus are injected into the polycrystalline silicon layer 104 to fabricate an n-type polycrystalline silicon layer 107 (first region) having an impurity concentration of, for example, $1 \times 10^{15}$ cm$^{-3}$.

Figure 5C:
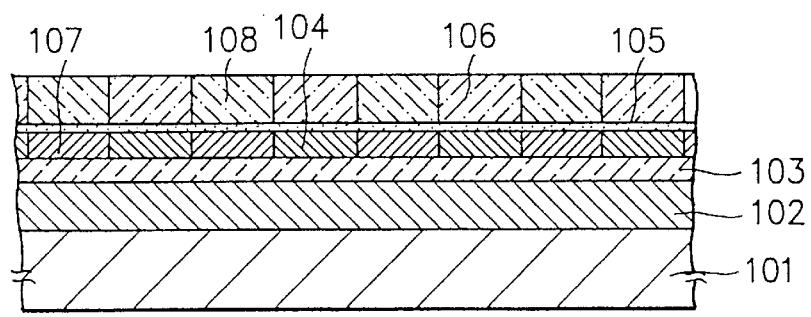

With the photoresist layer 106 set as a mask, a second silicon oxide layer 108 is selectively manufactured by liquid phase growth as shown in FIG. 5C. The liquid phase growth has been described, for example, in pages 315 to 322 of the NEC Research & Development, Vol. 32, No. 3 published in July 1991. This article gives a description of an example of liquid phase growth of a silicon dioxide layer.

In a liquid of $H_2SiF_6$ of a density with 3.5 mol/l, silicon oxide grains of high purity are dissolved to then be filtered so as to obtain a saturated aqueous solution. The solution is then added to a container having a stirrer. Then dewdrops of liquid $H_3BO_3$ from a dropper are placed onto a silicon wafer. The temperature of the saturated aqueous solution is 40° C. or less, e.g., 35° C., and the temperature and dropping speed of $H_2SiF_6$ liquid are 0.1 mol/l and 10 ml/h·l. After the dripping process is conducted for about two hours, a layer of silicon dioxide having a thickness of about 40 nanometers is accumulated on the silicon wafer. The unevenness of thickness is 2% or less.

In this way, the second mask region can be manufactured in a self-aligning fashion with respect to the first opening of the photoresist layer 106. Between the dimension of the second mask layer and that of the first mask layer, there exists a so-called complementary relationship.

Figure 5D:
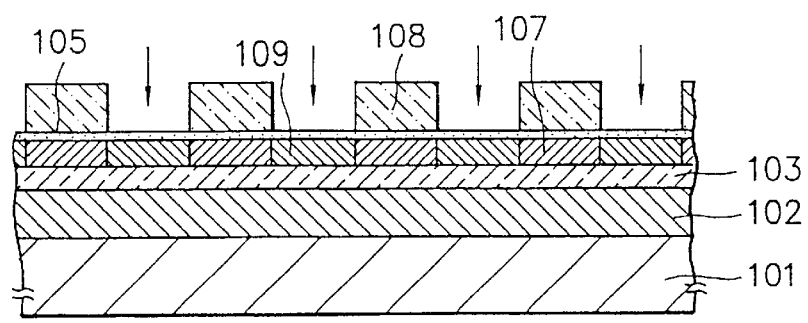

Next, the photoresist layer 106 is removed. Utilizing the second silicon oxide layer 108 as a mask, an impurity material (e.g., boron) of a conduction type opposite to that of the n-type polycrystalline silicon layer 107 is implanted into the polycrystalline silicon layer 104 to form a p-type polycrystalline silicon layer 109 (second region) having an impurity concentration of, e.g., $1 \times 10^{15}$ cm$^{-3}$, in a self-aligning manner with respect to the n-type polycrystalline silicon layer 107 as shown in FIG. 5D.

Figure 6:
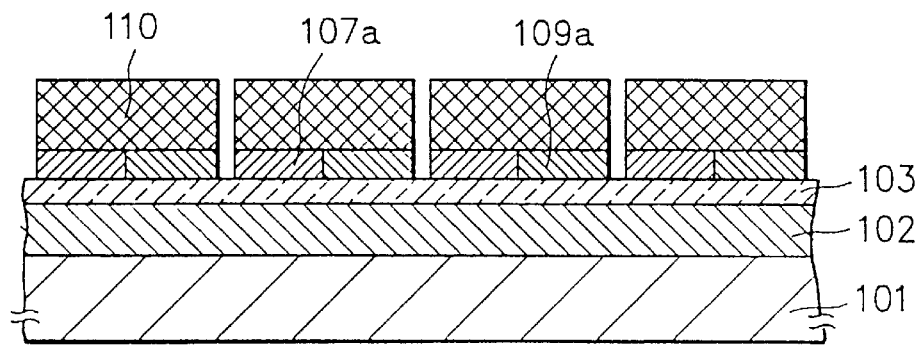
FIG. 6 is a cross-sectional view for explaining the first embodiment.

Subsequently, the first and second silicon oxide layers 105 and 108 are removed by etching, and then a photoresist layer 110 is formed by photoetching as shown in FIG. 6. Employing the layer 110 as a mask, a boundary between the n-type polycrystalline silicon layer 107 and the p-type polycrystalline silicon layer 109, as well as the proximity of the boundary, are etched to obtain a construction including the polycrystalline silicon layers 107a and 109a combined with each other. The combination is adopted as the charge transfer electrodes.

The photoresist layer 110 is removed in the next process. Fabricated thereon is an interlayer insulation layer 111 according to a known technology as shown in FIGS. 7A and 7B to thereafter from connection holes C1 and C2. Next a film of, e.g., aluminum is placed thereon. After a patterning process is carried out thereon, metallic wirings 112-1 and 112-2 are connected to every second charge transfer electrodes each including the n-type polycrystalline silicon layer 107 and the p-type polycrystalline silicon layer 109 as shown in the diagrams. This results in a configuration in which each charge transfer electrode includes two polycrystalline silicon layers of mutually different conduction types which are combined with each other and which are fabricated in a self-aligning manner. In this regard, transfer pulses φ1 and φ2 are respectively applied to the wirings 112-1 and 112-2. For example, initially it is in a state of φ1=10 V and φ2=0 V. Then when the state is charged to φ1=0 V and φ2=10 V, the charge that was accumulated beneath the electrode 107a to which φ1 is applied is moved through a potential barrier below the electrode 109a associated with φ2 to a region below the next electrode 107a. The state of potential is altered to φ1 =10 V and φ2=0 V and hence the charge is accumulated therein. By repeatedly conducting the cycle of operation above, the charge is sequentially transferred in the horizontal direction, i.e., either to the right or left in the diagram.

In the constitution of the present embodiment, the region below the n-type polycrystalline silicon layer 107a is used for charge accumulation and the region beneath the p-type polycrystalline silicon layer 109a is adopted as a potential barrier. Since these regions are manufactured in a self-aligning fashion with respect to charge transfer electrodes, it is possible to remove the projection and recess of potential at the edge portions of electrodes, resulting in a smooth transfer of charge.

In the design of charge transfer electrodes 107a and 109a, the (channel) lengths thereof can be set to desired values (e.g., the same value as in this embodiment). These values can be decided in consideration of the maximum amount of transfer charge and the charge transfer efficiency. Usually, the electrodes 107a and 109a have the same value. Also, the present invention is not restricted by the conventional example using the inclined ion injection. Moreover, the impurity substance is injected into the non-doped polycrystalline silicon layer in an independent fashion, i.e., the counter-doping is not carried out. Therefore, the impurity concentration of the p-type polycrystalline silicon layer 109a determining the height of the potential barrier is decided by, for example, the concentration of boron. In contrast with the conventional example in which the potential barrier height is related to the difference, for example, between the boron concentration and arsenic concentration of the p-type polycrystalline silicon layer 107, the present embodiment has an advantage of satisfactory reproducibility.

Figure 8A:
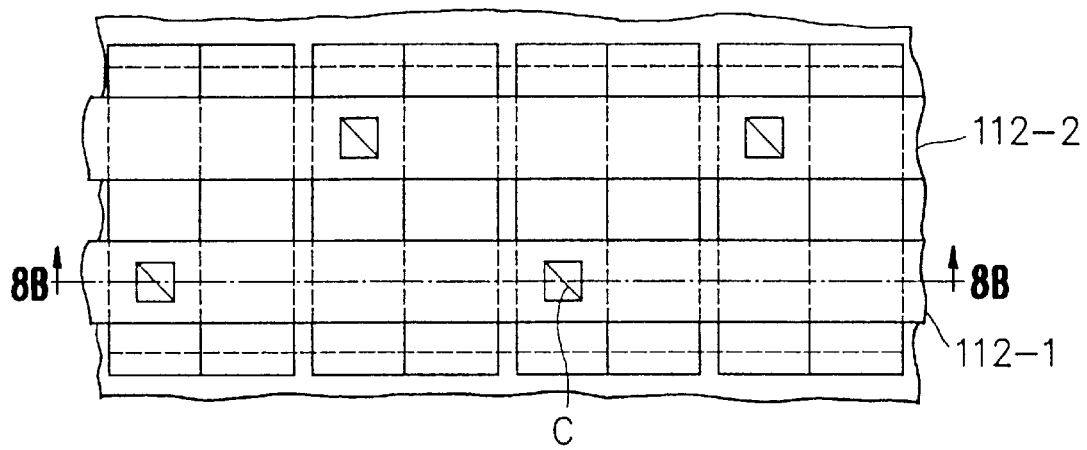
FIGS. 8A and 8B are a plan view and a cross-sectional view along line 8B—8B for explaining a variation of the first embodiment in accordance with the present invention.
Figure 8B:
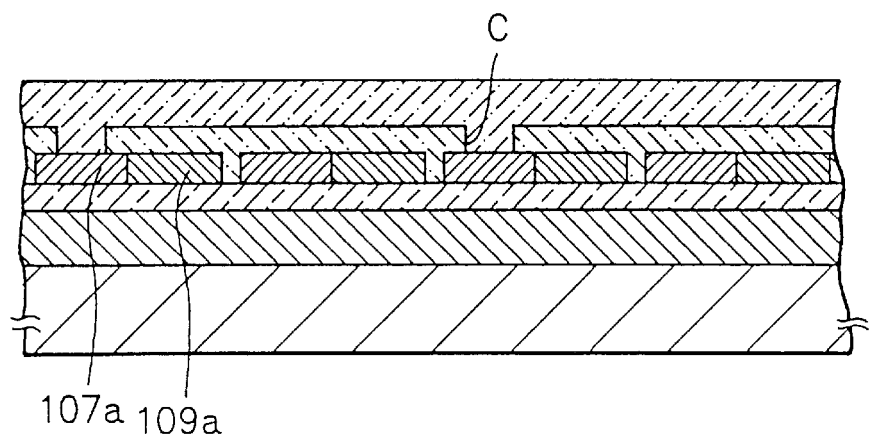

In accordance with the structure of the embodiment, the n-type polycrystalline silicon layer 107a and p-type polycrystalline silicon layer 109a are connected to the electrode wirings respectively through the connection holes C1 and C2. However, it may also possible, as shown in FIGS. 8A and 8B, that one connection hole C is utilized for each pair of charge transfer electrodes to establish a connection between the pair of electrodes and the electrode wiring. In this construction, the transfer pulse applied to the n-type layer 107a is propagated via pn-junction capacitance to the p-type layer 109a. Since the connection hole, which is not limited to this case, need only be linked with the pair of charge transfer electrodes, the configuration has an advantageous feature of increasing the connection margin. However, when compared with the structure of the first embodiment, the transfer speed is lowered (this is not the case with a configuration in which the connection hole C astrides the pn junction). This is because a short period of time is required before the layers 107a and 109a are set to the same potential due to the junction capacitance therebetween.

Subsequently, description will be given of a second embodiment of the method of a charge transfer device in accordance with the present invention.

Figure 9A:
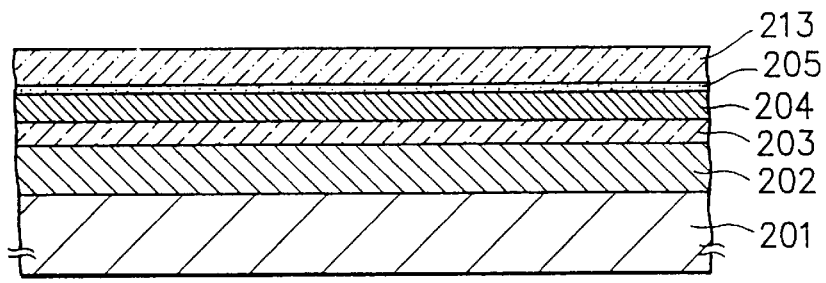
FIGS. 9A to 9D are cross-sectional views for explaining the configuration of a second embodiment of the method of manufacturing a charge transfer device in accordance with the present invention.

First, as shown in FIG. 9A, an n-type semiconductor layer 202 (n-type buried channel region) having a stripe contour is fabricated on a surface of a p-type semiconductor substrate 201 made of silicon. A gate insulation layer 203 is then formed on a surface of the n-type layer 202 in a thermal oxidation process so as to manufacture a non-doped polycrystalline layer 204 as a conductive electrode material on the insulation layer 203, the layer 204 having a thickness of about 0.2 micrometer. Next, a first silicon oxide layer 205 having a thickness of about 0.1 micrometer is fabricated on the layer 204, for example, by chemical vapor deposition and then a silicon nitride layer 213 (acid resistant layer) is fabricated thereon by chemical vapor deposition.

Figure 9B:
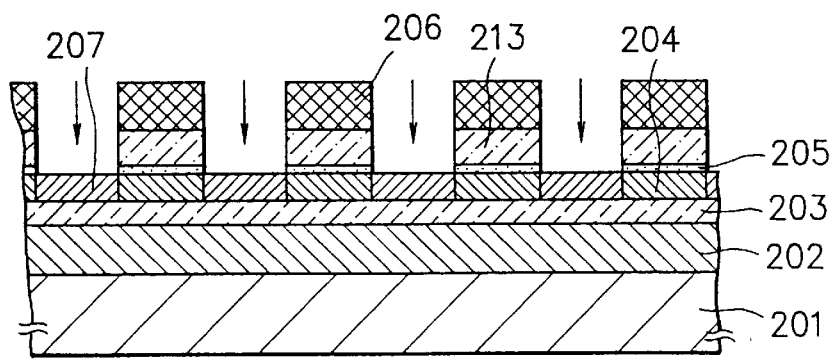

As can be seen from FIG. 9B, like in the configuration of the first embodiment, a photoresist layer 206 is formed by photoetching. With the layer 206 as a mask, a patterning process is carried out for the silicon nitride layer 213 and the first silicon oxide layer 205. Using the photoresist layer 206, the silicon nitride layer 213, and the first silicon oxide layer 205 as a mask, n-type impurity atoms of phosphorus are injected thereonto to attain an n-type polycrystalline silicon layer 207.

Figure 9C:
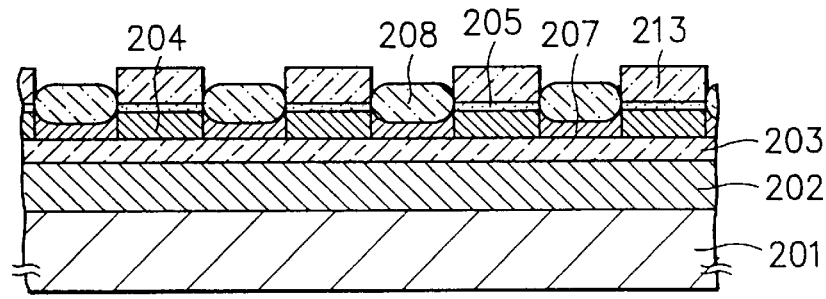

Removing the photoresist layer 206, a selective oxidation is accomplished using the silicon nitride layer 213 as a mask as shown in FIG. 9C. Namely, a second silicon oxide layer 208 is selectively fabricated only on the n-type polycrystalline silicon layer 207 not covered with the silicon nitride layer 213.

Figure 9D:
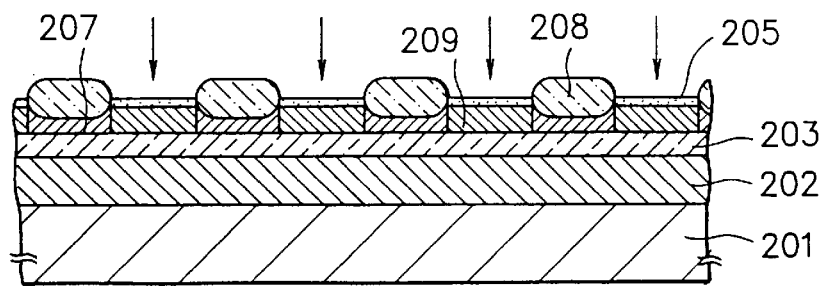

After the layer 213 is removed, impurity atoms such as boron atoms having a conduction type opposite to that of the n-type layer 207 are injected into the polycrystalline silicon layer 204 in an ion implantation process using the second silicone layer 208 as a mask. This forms a p-type polycrystalline silicon layer 209 in a self-aligning manner with respect to the n-type layer 207 as shown in FIG. 9D.

Figure 10A:
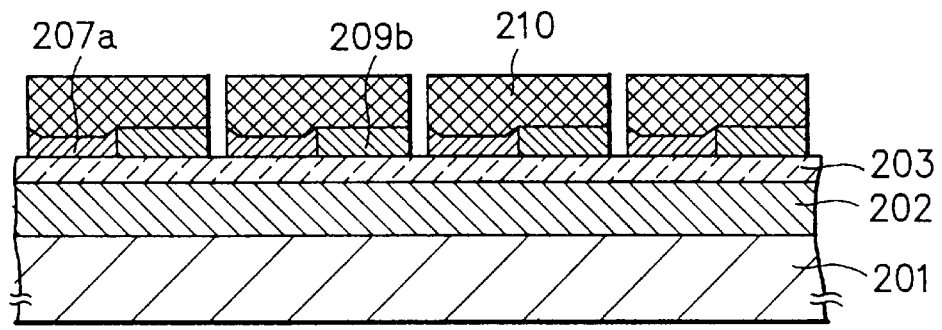
FIGS. 10A and 10B cross-sectional views for explaining the configuration of a second embodiment.

Subsequently, the first and second silicon oxide layers 205 and 208 are removed by etching, and then a photoresist layer 210 is created by photoetching as shown in FIG. 10A. Etching the polycrystalline silicon layer with the layer 210 as a mask, a group of charge transfer electrodes are manufactured, each including a pair of polycrystalline silicon layers 207a and 209a combined with each other, wherein these layers 207a and 209a have mutually different conduction types.

Figure 10B:
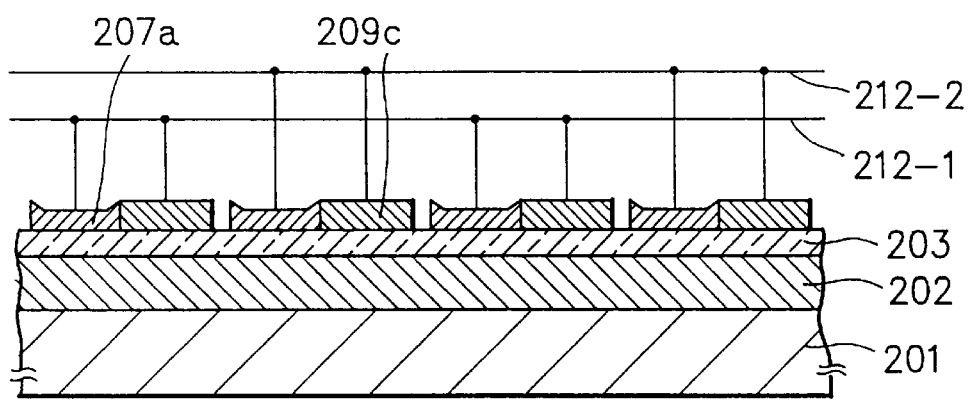
Figure 11:
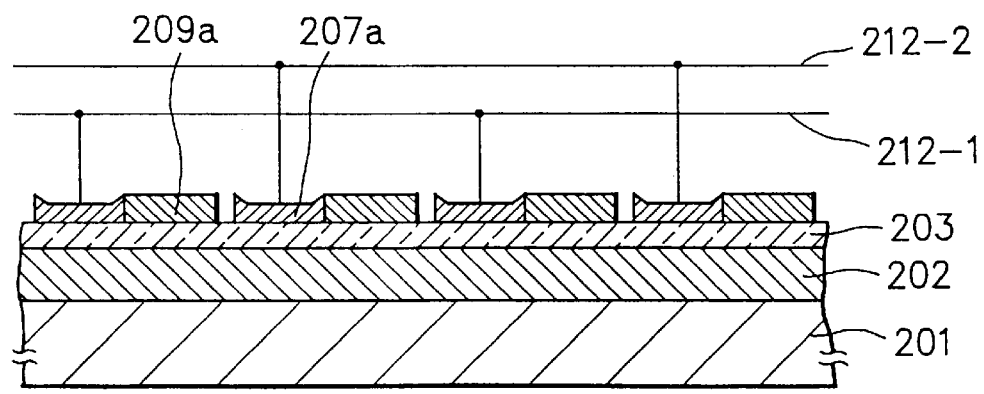
FIG. 11 is a cross-sectional view for explaining a variation of the second embodiment.

The photoresist 210 is then removed. Like in the configuration of the first embodiment, every two pairs of the layers 207a and 209a are respectively connected using a known technology to the metallic wirings 212-1 and 212-2, with an interlayer insulation layer (not shown) between the layers 207a and 209a and the wirings 212-1 and 212-2, as shown in FIG. 10B. Incidentally, also in the constitution of the second embodiment, the paired charge transfer electrode may be connected to the associated wirings at one position on the electrode (via a single hole) as shown in FIG. 11.

In the construction of the embodiments in accordance with the present invention, the charge transfer device is of an embedded channel structure. However, the present invention is applicable to any charge transfer devices of a surface channel structure. The n-type and p-type polycrystalline silicon regions may be fabricated in an arbitrary order. Furthermore, it is also possible to manufacture a p-type well region on a surface of an n-type silicon substrate so as to utilize the p-type well as a channel region. Additionally, the present invention is applicable to any configurations in which the conduction types of impurity substances are reversed.

Moreover, this description has been given of a method of fabricating a two-phase drive charge transfer device using two metallic wirings in which each metallic wiring is connected respectively to every two charge transfer electrodes. However, with N representing an integer greater than one, the present invention can be generally applied to an N-phase drive charge transfer device using N metallic wiring in total in which each metallic wiring is respectively linked with every N charge transfer electrodes. Specifically, it is only necessary to sequentially assign numbers to the charge transfer electrodes as 11, 12, . . . , 1N; 21, 22, . . . , 2N; N1, N2, . . . , NN such that electrodes 11 to 1N are coupled with the first wiring, electrodes 21 to 2N are coupled with the second wiring, and so forth and electrodes N1 to NN are connected to the N-th wiring so as to apply transfer pulses respectively thereto.

In a single-phase electrode structure including a junction between a first region and a second region having mutually different conduction types, the size of a first mask layer and that of a second mask layer which are used to implant impurity substances into a polycrystalline layer can be arbitrarily set within lithography restrictions. Therefore, the dimensions, respectively, of the first and second regions of the configuration can be set to the desired values in consideration of the charge transfer efficiency and the maximum amount of transfer charge. In short, this leads to an advantageous effect of an increase in the degree of freedom to design the charge accumulation region and the potential barrier region. Additionally, since the counter-doping is unnecessary, the reproducibility of the height of the potential barrier is advantageously improved.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A method of manufacturing a charge transfer device, comprising the steps of:

fabricating a gate insulation layer and a polycrystalline silicon layer sequentially on a semiconductor region having a first conduction type in a surface of a semiconductor substrate, the layers covering at least a portion of the surface of the semiconductor substrate;

manufacturing a first mask layer extending through the portion and including a plurality of first openings and inputting an impurity substance into the polycrystalline silicon layer below the first openings, thereby producing a plurality of first regions of one of a first and a second conduction type;

fabricating a second mask layer in a self-aligning fashion with respect to the first openings;

removing the first mask layer thereby forming a plurality of second openings and inputting an impurity substance of the other of the first and second conduction type into the polycrystalline silicon layer below the second openings, thereby forming a plurality of second regions alternatively positioned adjacent ones of said first regions; and separating the plurality of first and second regions into a plurality of adjacent charge transfer electrodes wherein each charge transfer electrode includes one first region and one second region adjacent thereto thereby forming a plurality of pairs of regions.

2. A method of manufacturing a charge transfer device in accordance with claim 1, wherein said portion comprises an embedded channel region of the second conduction type.

3. A method of manufacturing a charge transfer device in accordance with claim 1, further comprising the steps of:

fabricating a resist layer as the first mask layer; and selectively accumulating a silicon oxide layer by liquid phase growth, thereby forming the second mask layer.

4. A method of manufacturing a charge transfer device in accordance with claim 1, further comprising the steps of:

fabricating the first mask layer with an acid resistant layer on at least a part of the first mask layer; and forming the second mask by selective oxidation using the acid resistant layer as a mask.

5. A method of manufacturing a charge transfer device in accordance with claim 1, further comprising the steps of:

fabricating an interlayer insulation layer after the step of separating the first and second regions into the plurality of charge transfer electrodes;

forming a first connection hole and a second connection hole respectively reaching the first and second regions; and accumulating a conductive layer, filling the first and second connection holes with the conductive layer, and conducting a patterning operation on at least a part of the conductive layer, thereby a plurality of wirings.

6. A method of manufacturing a charge transfer device in accordance with claim 1, further comprising the steps of:

fabricating an interlayer insulation layer after the step of separating the first and second regions into the plurality of charge transfer electrodes; and forming connection holes reaching at least one of the first and the second regions.

7. A method of manufacturing a charge transfer device in accordance with claim 1, wherein the step of separating comprises the step of removing a boundary between adjacent pairs of regions thereby separating the charge transfer electrodes.

8. A method of manufacturing a charge transfer device in accordance with claim 6, further comprising the step of accumulating a conductive layer, filling the connection holes with the conductive layer, and conducting a patterning operation on at least a part of the conductive layer, thereby forming, a plurality of wirings.

* * * * *